(12) United States Patent
Rosenberg et al.

(10) Patent No.: US 8,469,607 B2
(45) Date of Patent: Jun. 25, 2013

(54) OPTO-ELECTRONICS WITH COMPLIANT ELECTRICAL CONTACTS

(75) Inventors: Paul Rosenberg, Sunnyvale, CA (US); Michael Renne Ty Tan, Menlo Park, CA (US); Sagi Mathai, Palo Alto, CA (US); Wayne Sorin, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 165 days.

(21) Appl. No.: 13/103,575

(22) Filed: May 9, 2011

(65) Prior Publication Data

US 2012/0288241 A1 Nov. 15, 2012

(51) Int. Cl.
*G02B 6/36* (2006.01)
*H05K 3/20* (2006.01)

(52) U.S. Cl.
USPC .............................................. 385/88; 29/831

(58) Field of Classification Search
None
See application file for complete search history.

(56) References Cited

U.S. PATENT DOCUMENTS

| | | | |
|---|---|---|---|
| 6,867,377 | B2 | 3/2005 | Anderson et al. |
| 6,985,659 | B2 | 1/2006 | Torigoe et al. |
| 7,042,082 | B2 | 5/2006 | Epitaux et al. |
| 7,070,341 | B2 | 7/2006 | Rathnam et al. |
| 7,275,937 | B2 | 10/2007 | Ellison |
| 7,329,054 | B1 * | 2/2008 | Epitaux et al. .................. 385/89 |
| 2004/0218848 | A1 | 11/2004 | Shen et al. |
| 2009/0148106 | A1 | 6/2009 | Moore et al. |
| 2009/0315042 | A1 | 12/2009 | Nemoto |

* cited by examiner

*Primary Examiner* — Sarah Hahm

(57) ABSTRACT

Methods and apparatus are provided related to opto-electronics. An opto-electronic subassembly includes electrical contacts bonded to a base by way of a compliant adhesive. The opto-electronic subassembly is mechanically engaged to a circuit board resulting in contact force loading of the compliant adhesive. Such loading maintains electrical coupling between the electrical contacts and respective circuit pathways of the circuit board. Optical signal communication between the opto-electronic subassembly and another entity is performed by way of an optical connector.

12 Claims, 8 Drawing Sheets

OPTO-ELECTRONICS WITH COMPLIANT ELECTRICAL CONTACTS

BACKGROUND

Various systems and devices operate by way of electrical and optical signaling. Typically, metallic conductors couple electrical signals between circuit boards or other entities so that normal operations can be performed. Similarly, optical fibers and other means are used to route lightwave signals between opto-electronic devices and corresponding entities.

Electronic, opto-electronic, and other devices often have numerous, relatively small electrical contacts to be coupled with contacts of another entity or entities. However, surface contour irregularities, non-planarity and other undesirable characteristics coincident to the electrical contacts can result in intermittent or failed electrical signal communications between entities. The present teachings address the foregoing and other concerns.

BRIEF DESCRIPTION OF THE DRAWINGS

The present embodiments will now be described, by way of example, with reference to the accompanying drawings, in which.

DETAILED DESCRIPTION

Introduction

Methods and apparatus are provided related to opto-electronics. An opto-electronic subassembly includes electrical contacts that are bonded to a base by way of a compliant adhesive. The opto-electronic subassembly can be mechanically engaged to a circuit board, resulting in contact force-loading of the compliant adhesive. Such loading maintains electrical coupling between the electrical contacts and respective counterpart contacts or circuit pathways of the circuit board. Electronic signals can be communicated between the circuit board and the opto-electronic subassembly. In turn, optical signals corresponding to the electronic signals can be communicated between the opto-electronic subassembly and another entity by way of an optical connector.

In one embodiment, an apparatus includes a base including a first side and a second side opposite the first side. The apparatus also includes a flexible circuit including respective electrical contacts. The flexible circuit is bonded to the first side of the base. Edge portions of the flexible circuit are folded such that the electrical contacts are bonded to the second side of the base by way of an adhesive. The electrical contacts are independently displaceable in accordance with a compliant characteristic of the adhesive.

In another embodiment, a system includes a printed circuit board including respective circuit pathways. The system also includes an opto-electronic subassembly removably coupled to the printed circuit board by way of a cantilever latch arrangement. The opto-electronic subassembly including respective electrical contacts in compliant contact with the circuit pathways such that electrical coupling is maintained there between. The system also includes an optical connector having one or more optical waveguides coupled in optical communication with the opto electronic subassembly.

In still another embodiment, a method includes removably coupling an opto-electronic subassembly to a circuit board. The opto-electronic subassembly is in electrical signal communication with the circuit board by way of electrical contacts. The electrical contacts are in mechanically compliant contact with respective circuit pathways of the circuit board.

Illustrative Opto-Electronic Engine

Figure 1:
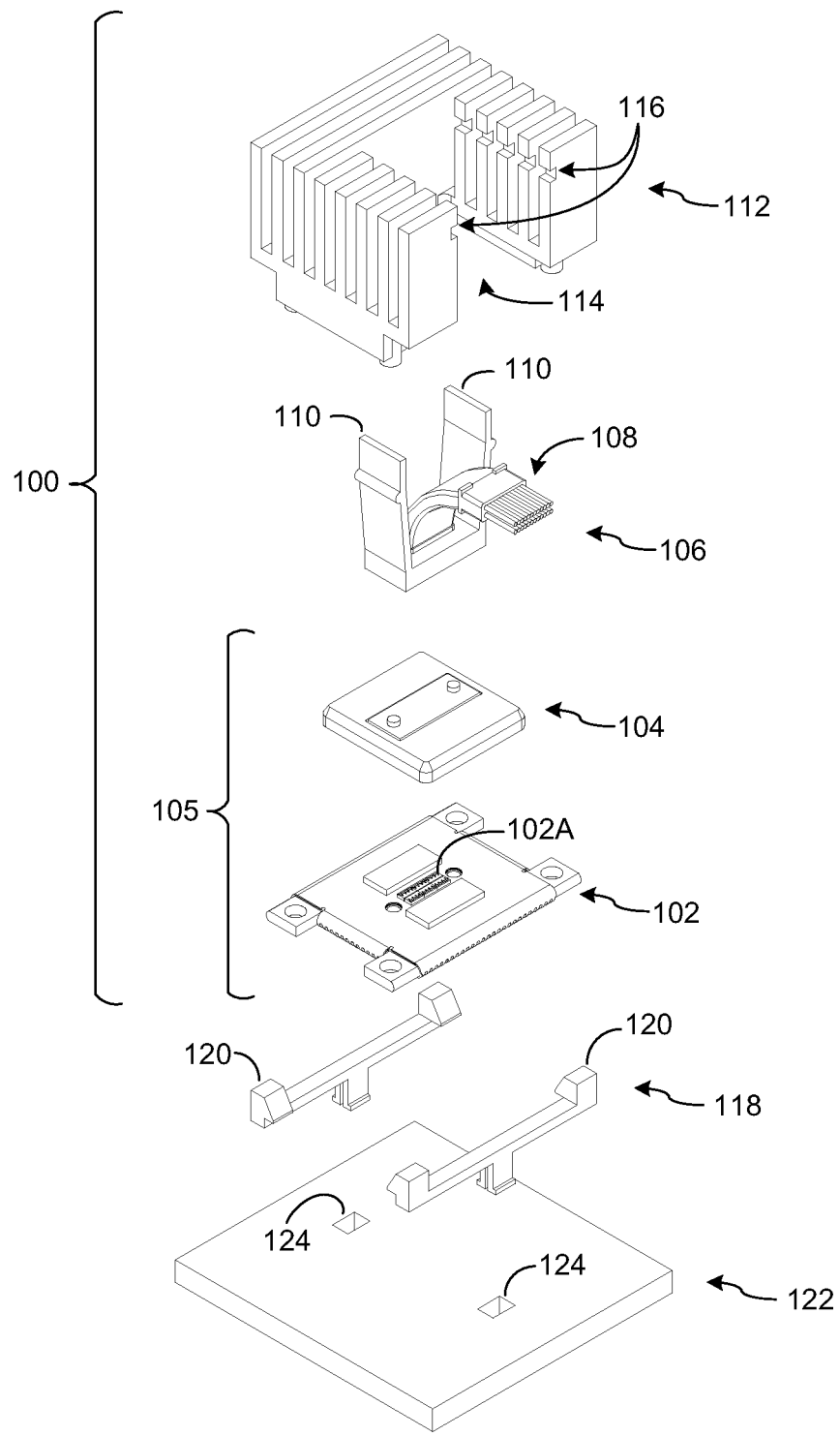
FIG. 1 is an exploded isometric view depicting a lightwave communications apparatus according to one example.

Reference is now directed to FIG. 1, which depicts an exploded isometric view of an apparatus 100. The apparatus 100 is illustrative and non-limiting with respect to the present teachings. Thus, other circuits, apparatuses, devices or systems can be configured and operated in accordance with the present teachings.

The apparatus 100 collectively defines an opto-electronic engine (OE engine) 100. The OE engine 100 includes an opto-electronic subassembly (OE subassembly) 102. The OE subassembly 102 includes electronic components or devices, and a laser diode and photodiode array (LDPDA) 102A electrically coupled to a flexible circuit. The OE subassembly 102 also includes elements bonded to a base by way of adhesive materials. Further description regarding the OE engines according to the present teachings is provided hereinafter.

The OE engine 100 also includes a cover and lens array (CLA) 104. The CLA 104 is configured to be disposed over the OE subassembly 102 as introduced above. The CLA 104 operates to protect electronic and optical elements of the OE subassembly 102 and to provide lenses that optically couple the LDPDA 102A with respective lightwave guides or optical fibers of an optical connector 106. Further description regarding the CLA 104 and analogous embodiments according to the present teachings is provided hereinafter. OE subassembly 102 and the CLA 104 collectively define an opto-electronic module 105.

The OE engine 100 also includes an optical connector 106 as introduced above. The optical connector 106 includes a plurality of optical fibers or lightwave guides (i.e., optical waveguides) 108 to convey respective lightwave (e.g., laser) signals between the OE subassembly 102 and another entity (not shown). The optical connector 106 also includes respective cantilever latches 110. The cantilever latches 110 are configured to removably secure the optical connector 106 in cooperative alignment with the OE subassembly 102 by way of mechanical engagement with a heat sink 112. In another example, the optical waveguides (e.g., 108) are permanently attached in optical communication with the OE subassembly (e.g., 102). Further description regarding the optical connector 106 and analogous embodiments according to the present teachings is provided hereinafter.

The OE engine 100 also includes a heat sink 112 as introduced above. The heat sink 112 can be formed from any suitable thermally conductive material such as aluminum, brass, and so on. The heat sink 112 operates to dissipate heat generated by the OE subassembly 102 into the surrounding environment. The heat sink 112 defines a gap or void 114 sized to receive or accommodate the optical connector 106. The heat sink 112 further defines a pair of respective slots or channels 116 to mechanically engage the cantilever latches 110 of the optical connector 106. Further description regarding the heat sink 112 and analogous embodiments according to the present teachings is provided hereinafter.

The OE engine 100 is configured to be electrically and mechanically mated (or joined) to a circuit board 122 by way of a pair 118 of latches 120. Each of the latches 120 can be formed from any suitable material such as plastic, metal, and so on. Other suitable materials can also be used. The latches 120 are configured to removably secure the OE engine 100 to the circuit board 122 by way of grasping mechanical engagement.

The circuit board 122 can include any suitable electrical or electronic devices or components, as well as circuit pathways (not shown) configured for electrically conductive contact with respective electrical contacts of the OE subassembly 102. The circuit board 122 also defines respective apertures 124 to receive and mechanically engage the latches 120.

The OE engine 100 includes respective elements, features and sub-assemblies 102-116, inclusive, as described above, which are secured in place on the circuit board 122 in a final assembled form. Such a final assembled form is described below.

Illustrative Opto-Electronic Subassembly

Figure 2A:
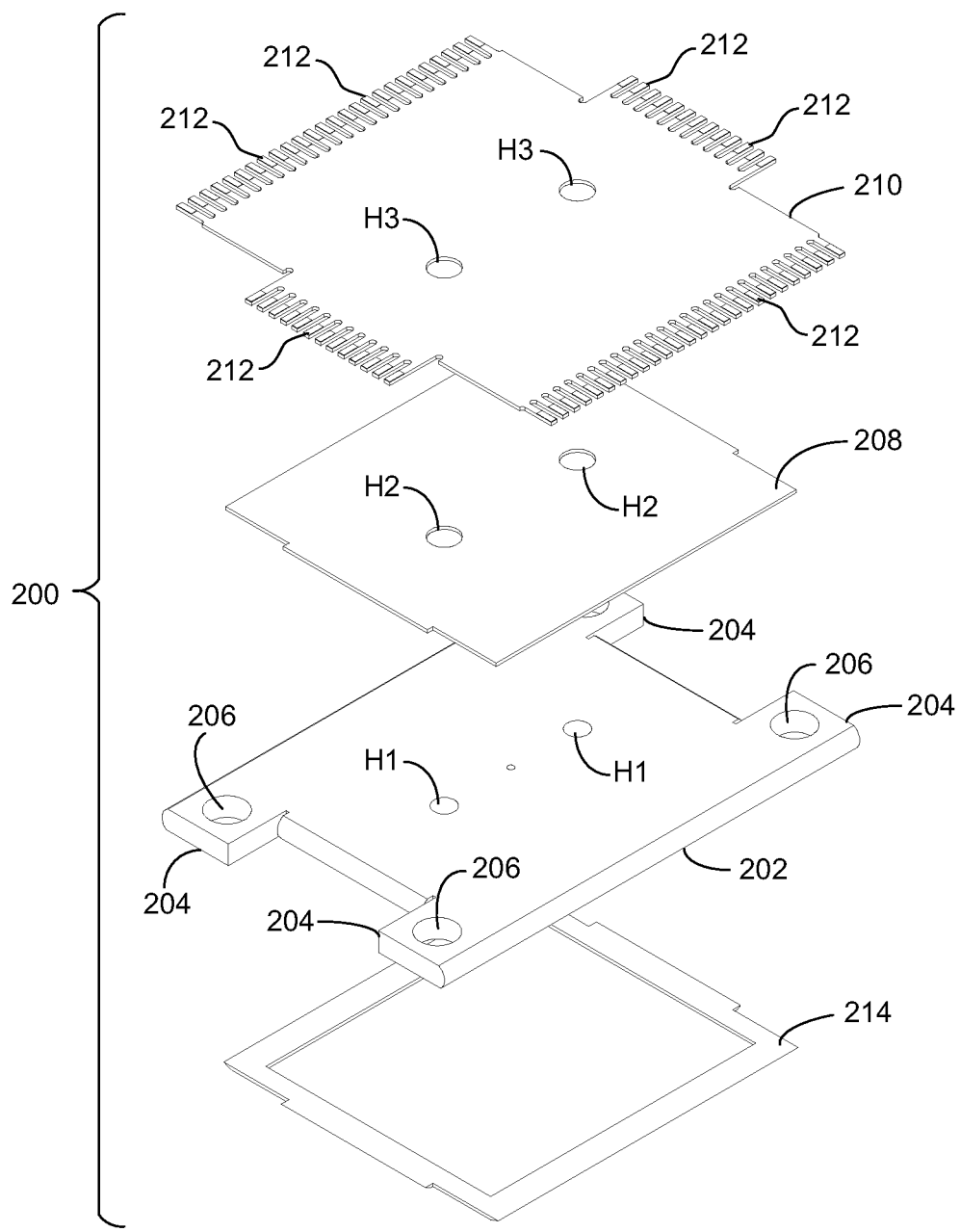
FIG. 2A is an exploded isometric view depicting elements of an opto-electronic subassembly according to another example.

Attention is now directed to FIG. 2A, depicts an exploded isometric view of selected elements of an OE engine, which are collectively referred to herein as an electrical subassembly 200. The electrical subassembly 200 is illustrative and non-limiting with respect to the present teachings. In one example, the electrical subassembly 200 is substantially equivalent to a portion of the OE subassembly 102. However, other sub-assemblies, apparatuses, devices or systems can be configured and operated in accordance with the present teachings.

The electrical subassembly 200 includes a base 202. The base 202 can be formed from any suitable rigid and thermally conductive material such as aluminum, copper, brass, and so on. In one example, the base 202 is formed from copper having a thickness of about two millimeters. Other materials or thicknesses can also be used. The base 202 includes four extension portions 204 each defining a through aperture 206. A heat sink unit (e.g., 112) can be joined or secured to the base 202 using fasteners by way of the through apertures 206. In one example, a fine blanking process is used to produce the base 202 in the interest of precision shaping and formation.

The electrical subassembly 200 also includes an adhesive material 208 to secure or bond a flexible circuit portion 210 to the base 202. The adhesive material 208 can be provided or used in the form of films, sheets, liquids and so on, respectively.

The electrical subassembly 200 also includes a flexible circuit 210. The flexible circuit 210 includes a plurality of electrical contacts 212 defined about the periphery of the flexible circuit 210. The electrical contacts 212 are electrically coupled to (or are portions of) respective circuit pathways of the flexible circuit 210. Such circuit pathways are not depicted in the interest of clarity. The electrical contacts 212 are electrically coupled to various electronic devices, components and electrical nodes when the flexible circuit 210 is in an assembled state, as described in further detail hereinafter.

It is noted that the base 202, the adhesive material 208 and the flexible circuit 210 are defined by apertures or index holes "H1", "H2" and "H3", respectively. The index holes H1 are used as alignment datum to position the laser and photodiode arrays (102A) to the lens array (320, described below) via respective locating pins (322 and 324, described below). The index holes H1-H3 are also used to ensure proper alignment of the base 202, the adhesive material 208 and the flexible circuit 210 during assembly.

The electrical subassembly 200 further includes a pressure sensitive adhesive material (adhesive material) 214 to secure or bond the electrical contacts 212 of the flexible circuit portion 210 to an underside periphery of the base 202. In one example, the adhesive material 214 is defined by or includes a pressure sensitive adhesive film, as is available from FLEXcon, Spencer, Mass., USA. Other suitable adhesives, in the form of films, sheets, liquids and so on, respectively, can also be used. The adhesive material 214 is defined by a compliant characteristic so as to yield to a compressive force, and is thus also referred to as a compliant adhesive material 214.

Figure 2B:
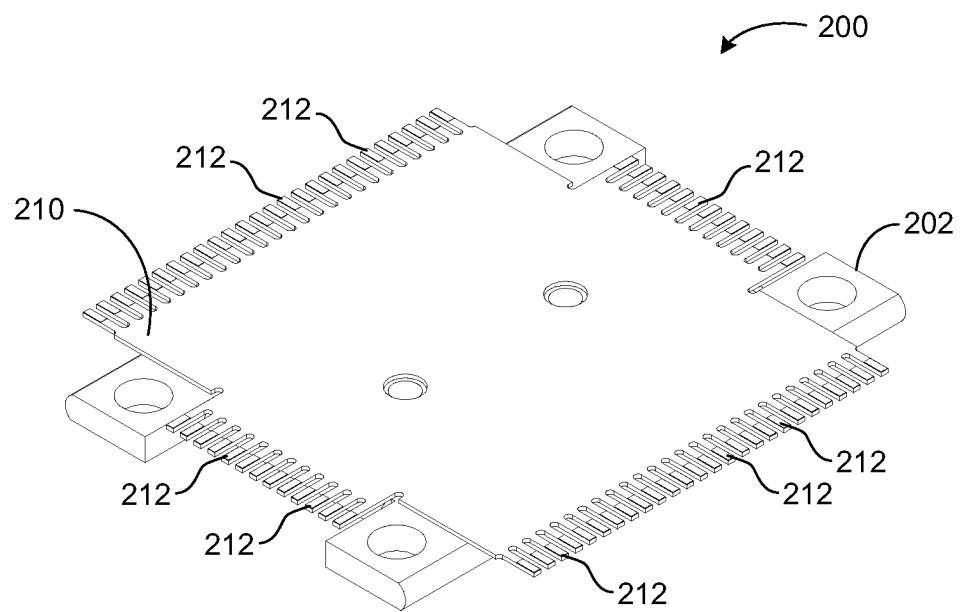
FIG. 2B is an isometric view depicting the opto-electronic subassembly of FIG. 2A in a partially assembled state.

Reference is now made to FIG. 2B, which depicts an isometric view of the electrical subassembly 200 in a partially assembled state. The flexible circuit 210 is aligned with and bonded to the base 202 by way of the adhesive 208. It is noted that the electrical contacts 212 extend beyond the periphery of the base 202 and are not yet bonded thereto. The electrical contacts 212 are thus configured to be flexibly wrapped over respective edge portions of the base 202.

Figure 2C:
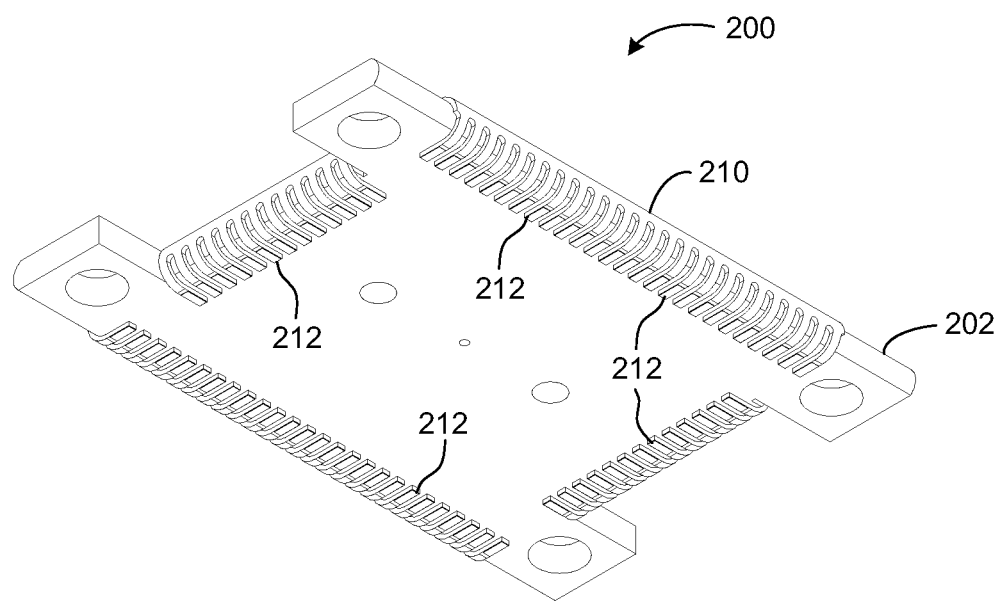
FIG. 2C is an isometric view depicting the opto-electronic subassembly of FIG. 2A in an assembled state.

Attention is now turned to FIG. 2C, which depicts an isometric view of the electrical subassembly 200 in an assembled state. The electrical contacts 212 are wrapped over respective adjacent edge portions of the base 202 and are secured in place by way of the compliant adhesive material 214. It is noted that the compliant adhesive material 214 is disposed between the outward-facing contacts 212 and the base 202 in this assembled state. The electrical contact 212 are thus configured to electrically contact or communicate with other respective electrical contacts, nodes or circuit pathways borne by another entity such as, for non-limiting example, the circuit board 122.

The electrical contacts 212 are configured to make reliable electrical contact with another entity by way of the compliant characteristic of the adhesive material 214. For example, the electrical subassembly 200 can be positioned in contact with a circuit board 122 and held in place under a compressive force by way of latches 120. Each of the electrical contacts 212 is able to flex independently in accordance with surface contours or irregularities of the circuit board 122 while maintaining electrical communication with a respective electrical contact or other feature.

Illustrative OE Subassembly and CLA

Figure 3A:
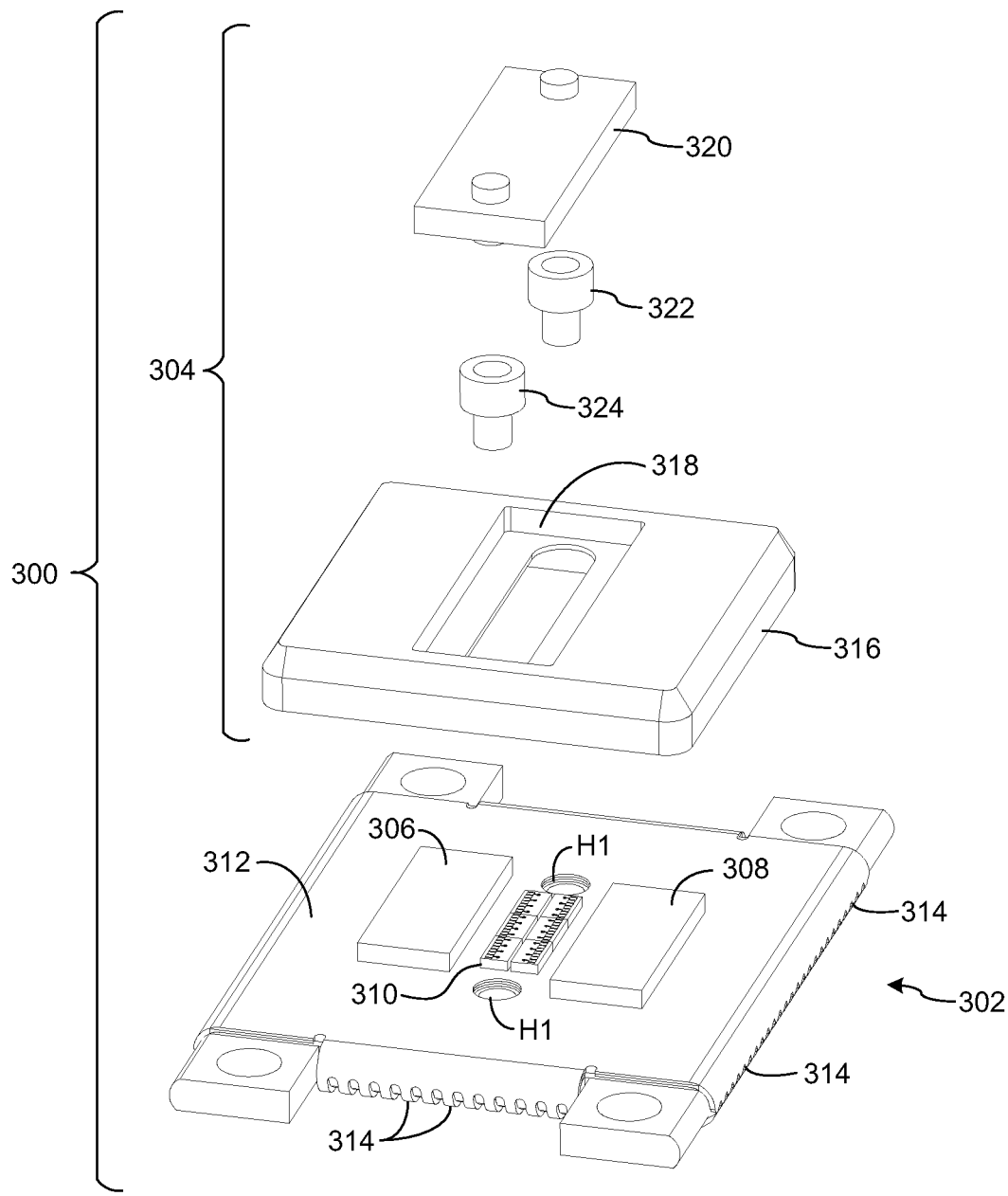
FIG. 3A is an exploded isometric view depicting an opto-electronic subassembly and a cover and lens array according to another example.

Attention is now turned to FIG. 3A, which depicts an exploded isometric view of an assemblage 300 including an opto-electronic subassembly (OE subassembly) 302 and a cover and lens array (CLA) 304. The assemblage 300 is illustrative and non-limiting with respect to the present teachings. In one example, the OE subassembly 302 is substantially equivalent to the OE subassembly 102. In one example, the CLA 304 is substantially equivalent to the CLA 104. However, other sub-assemblies, apparatuses, devices or systems can be configured and operated in accordance with the present teachings.

The OE subassembly 302 includes integrated circuits 306 and 308, respectively. The integrated circuits 306 and 308 can be respectively defined by any suitable electronic integrated circuits or components as required or desired for normal operations. In one example, the integrated circuit 306 drives respective laser diodes in accordance with electronic signals to be transmitted, while the integrated circuit 308 amplifies analog signals received by way of a respective photodiodes for communication with corresponding digital circuitry. In one example, the integrated circuit 306 is defined by a model IPVD16G12C, available from IPtronics, Denmark, while the integrated circuit 308 is defined by a model IPTA16G12C, available from IPtronics, Denmark. Other integrated circuits 306 or 308 corresponding to other operations or functions can also be used.

OE subassembly 302 also includes a laser diode and photodiode array (LDPDA) 310. In one example, the LDPDA 310 is defined by a two dimensional array composed of a one dimensional array of laser diodes and a one dimensional array of photodiodes. Other LDPDA 310 configurations can also be used. In one example, the laser diode array is defined by a model V850-209X-002, available from Finisar, Sunnyvale, Calif., USA, while the photodiode array is defined by a model DO136-70um-PIN4, available from Global Communications Semiconductors, Inc., Torrance, Calif., USA. Other respective types can also be used.

The LDPDA 310 is configured to perform unidirectional or bidirectional optical communications with one or more other entities (distinct from the OE subassembly 302) by way of lightwave signaling. In one example, the LDPDA 310 is coupled in electronic signal communication with either or both of the integrated circuits 306 and 308 by way of circuit traces or pathways (not shown) borne by a flexible circuit 312 of the OE subassembly 302. The circuit traces or pathways are electrically coupled to or include respective electrical contacts 314 disposed about the periphery of the OE subassembly 302.

The CLA 304 includes a cover 316. In one example, the cover 316 is formed from molded plastic. The cover 316 protects the integrated circuits 306 and 308 and the LDPDA 310, and also operates to extract heat from the ICs and LDPDA devices. The cover 316 defines a window or aperture 318 that is centered over the LDPDA 310 when the assemblage 300 is in an assembled state.

The CLA 304 also includes a lens array 320. The lens array 320 includes a plurality of individual lens-like features (i.e., micro-lenses) configured to optically couple each laser diode of the LDPDA 310 with a corresponding optical fiber (e.g., 108) of an optical connector (e.g., 106). In one example, the lens array 320 is defined by a two-by-twelve array. The lens array 320 can be formed from optical-grade plastic, glass or another suitable material. The lens array 320 is configured to be aligned with and at least partially received into the aperture 318 of the cover 316.

The lens array 320 and the cover 316 are aligned with and mechanically joined to the OE subassembly 302 by way of respective post extensions 322 and 324. In turn, the post extensions 322 and 324 are received within respective apertures or index holes "H1" of the OE subassembly 302. The LDPDA 310 has also been attached precisely with respect to index hole H1. Thus, all parts in the optical path including the LDPDA 310 and the respective post extensions 322 and 324 are precisely attached with respect to H1 and are properly aligned with respect to each other. Efficient optical coupling is thereby achieved between the optical fibers, 108, and the LDPDA 310. The post extensions 322 and 324 can be formed from any suitable material such as, for non-limiting example, plastic, metal, and so on.

Figure 3B:
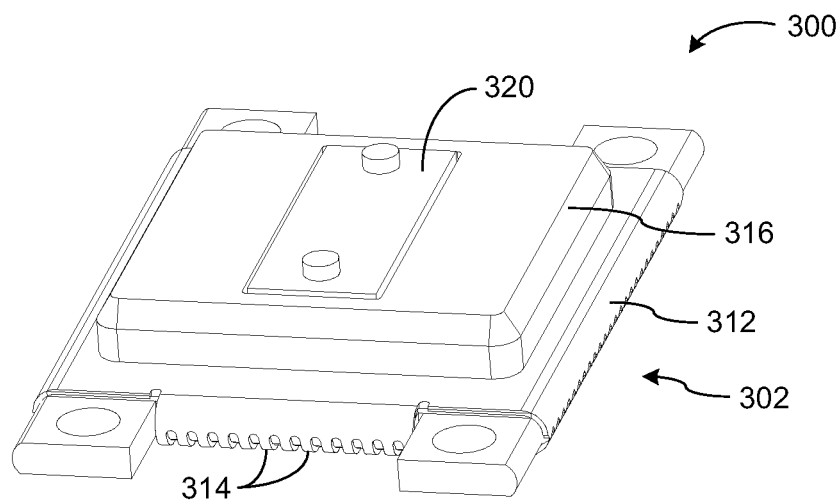
FIG. 3B depicts an isometric view of the elements of FIG. 3A in an assembled state.

Reference is now made to FIG. 3B, which depicts an isometric view of the assemblage 300 in an assembled state. The OE subassembly 302 and the cover 316 and the lens array 320 are aligned and fully assembled and are collectively referred to herein as a finished opto-electronic module 300. It is noted that the electrical contacts 314 are exposed about the periphery of the OE subassembly 302 and can be brought into compliant electrical contact with corresponding electrical contacts of another entity.

Illustrative OE Subassembly and Heat Sink

Figure 4A:
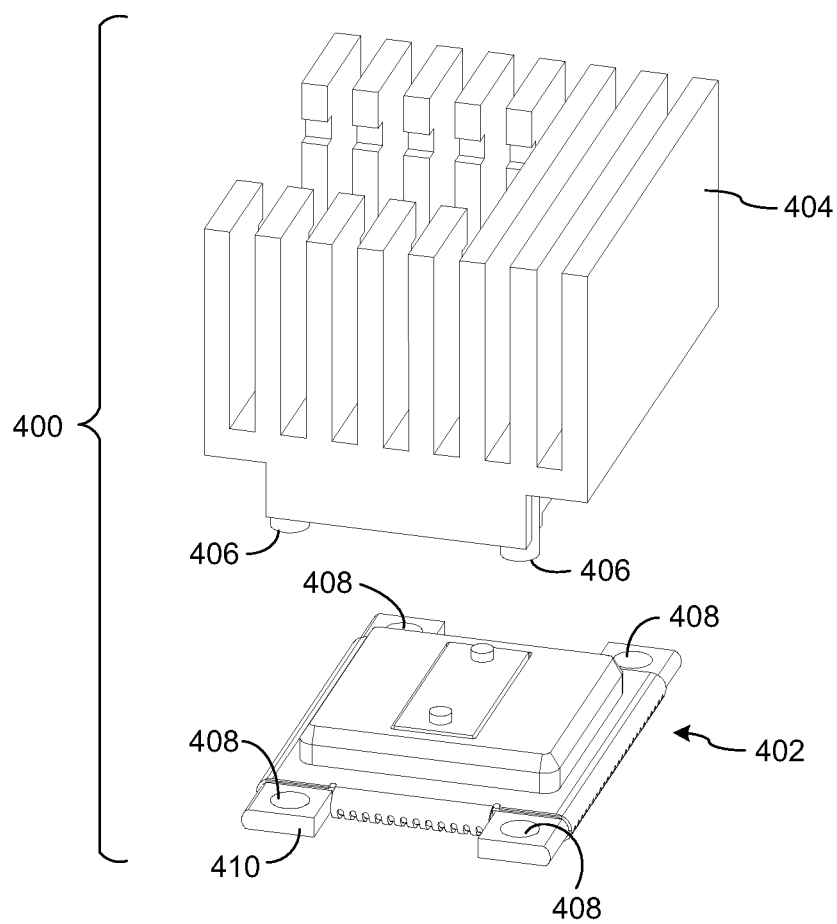
FIG. 4A is an exploded isometric view depicting an opto-electronic module and a heat sink according to yet another example.

Attention is now turned to FIG. 4A, which depicts an exploded isometric view of an assemblage 400 including an opto-electronic module (OE module) 402 and a heat sink 404. The assemblage 400 is illustrative and non-limiting with respect to the present teachings. In one example, the OE module 402 is substantially equivalent to the opto-electronic module 300. In one example, the heat sink 404 is substantially equivalent to the heat sink 112. However, other sub-assemblies, apparatuses, devices or systems can be configured and operated in accordance with the present teachings.

The heat sink 404 is configured to be mechanically joined to the OE module 402 by way of posts or extensions 406 received within corresponding apertures 408. The posts 406 are formed of aluminum, brass or another metal or thermally-conductive material the same as or compatible with the remainder of the heat sink 404. In turn, the apertures 408 are defined in a base 410 of the OE module 402. The base 410 is formed from aluminum, copper or another suitable thermally conductive material. In one example, the base 410 is substantially equivalent to the base 202 described above.

The heat sink 404 is configured to receive heat by thermal conduction from the OE module 402 during normal operations. The heat sink 404 then dissipates such heat by convection or radiation or a combination thereof to the surrounding environment (e.g., air). The electronic and optical devices (e.g., 306, 308 and 310) of the OE module 402 thus dissipate heat generated during normal operations by way of the heat sink 404, when the assemblage 400 is in a fully assembled state.

Figure 4B:
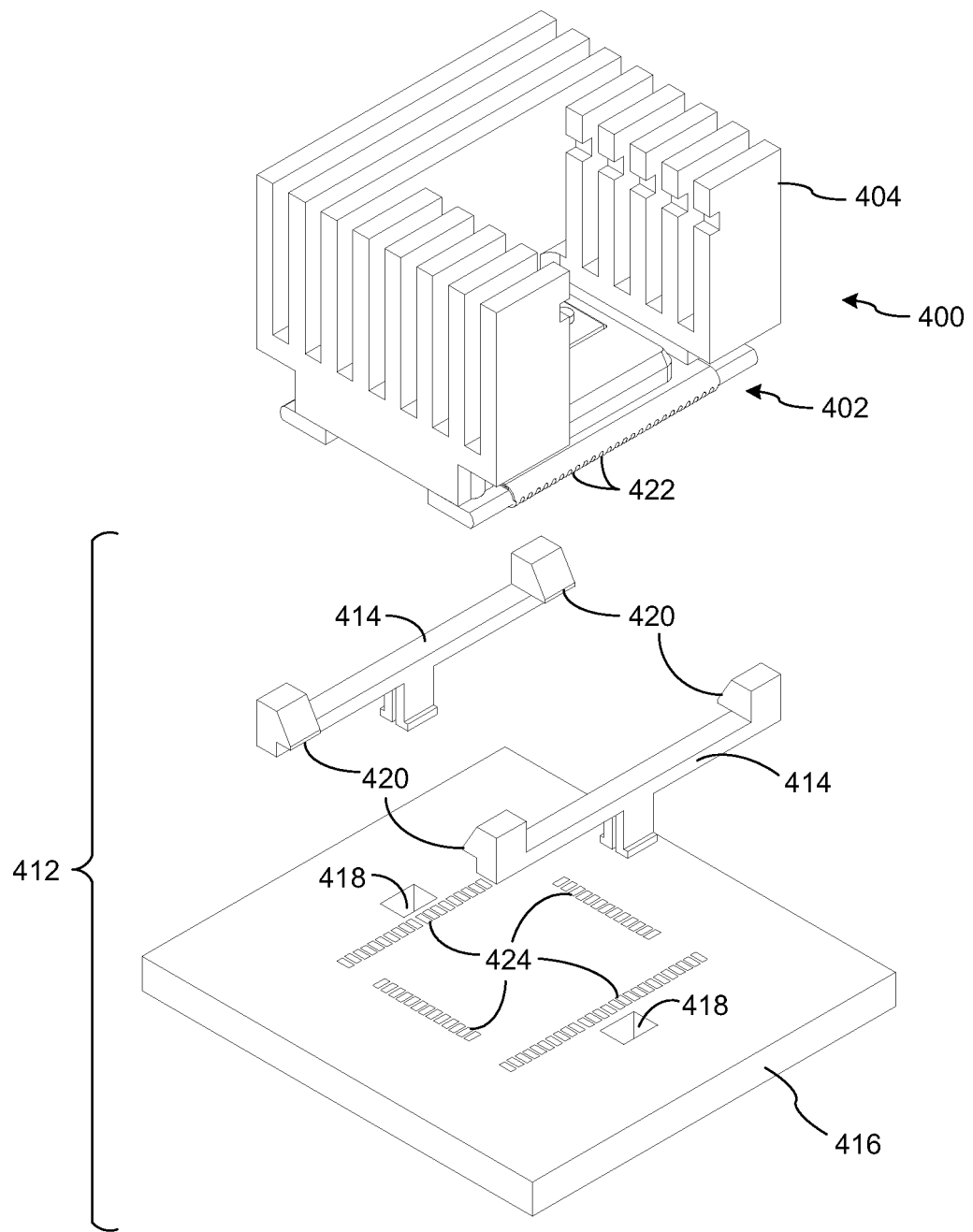
FIG. 4B is an exploded isometric view of the elements of FIG. 4A and a mounting arrangement in accordance with another example.

Attention is now turned to FIG. 4B, which depicts an exploded isometric view of the assemblage 400 and a mounting arrangement 412. The mounting arrangement 400 includes a pair of respective latches 414. The latches 414 are configured to removably secure the OE module 402 to a circuit board 416.

In particular, each of the latches 414 is configured to mechanically engage a respective aperture or mounting hole 418 defined by the circuit board 416. In turn, the latches 414 secure the OE module 402 to the circuit board 416 by way of wedge or tooth-like features 420. Electrical contacts 422 of the OE module 402 are held in contact with corresponding electrical nodes or contacts 424 of the circuit board 416 by way of the latches 414. Thus, the opto-electronic module 402, being joined to the heat sink 404, is removably coupled to and in electrical communication with the circuit board 416 when in an assembled state.

Illustrative OE Subassembly and Optical Connector

Figure 5:
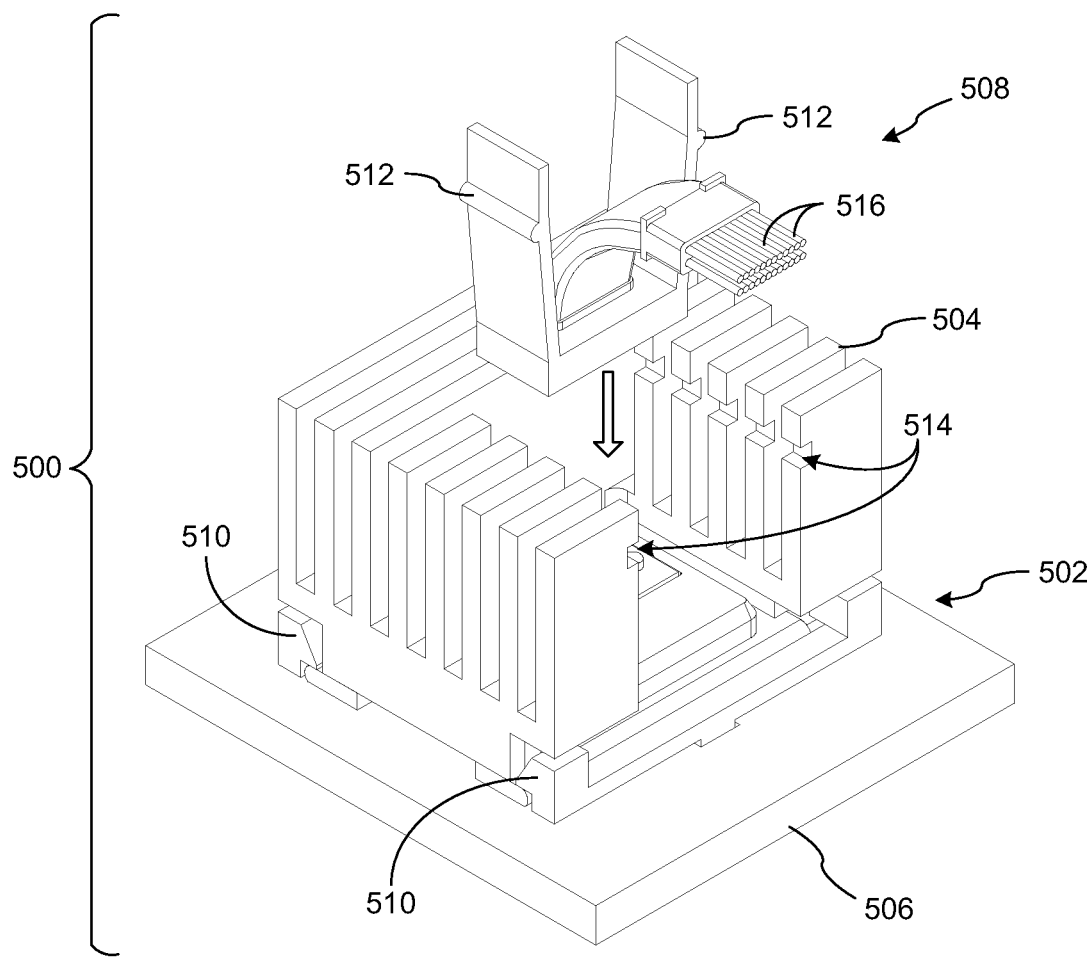
FIG. 5 is an exploded isometric view including an opto-electronic module and a heat sink and a circuit board and an optical connector in accordance with another example.

Reference is now turned to FIG. 5, which depicts an exploded isometric view of an assemblage 500 including an opto-electronic module (OE module) 502, a heat sink 504, a circuit board 506 and an optical connector 508. The assemblage 500 is illustrative and non-limiting with respect to the present teachings. In one example, the OE module 502 is substantially equivalent to the OE module 402, while the heat sink 504 is substantially equivalent to the heat sink 404 and the circuit board 506 is substantially equivalent to the circuit board 416. However, other sub-assemblies, apparatuses, devices or systems can be configured and operated in accordance with the present teachings.

The OE module 502 and the heat sink 504 are mechanically coupled or joined as described above in regard to the OE module 402 and the heat sink 404. In turn, the OE module 502 is removably secured to the circuit board 506 by way of respective latches 510. Thus, the OE module 502 is mated in electrical signal communication with respective circuit pathways and nodes of the circuit board 506.

The assemblage 500 further includes the optical connector 508 introduced above. The optical connector 508 includes or is defined by respective cantilever latches (latches) 512. The latches 512 are configured to mechanically engage respective slots or channels 514 defined by the heat sink 504. Thus, the optical connector 508 assumes a removably engaged position (as depicted by the arrow) within the heat sink 504 and is in aligned adjacency with the OE module 502 when in an assembled state.

The optical connector 508 includes a plurality of optical fibers or lightwave pathways 516. These optical fibers 516 are in optical communication alignment with respective laser diodes and photodiodes of an LDPDA (e.g., 310) of the OE module 502 when the optical connector 508 is mechanically engaged to the heat sink 504. Data and other communication between the circuit board 506 and another entity (not shown) using lightwave signaling can be performed by way of the OE module 502 and the optical connector 508.

Illustrative Method

Figure 6:
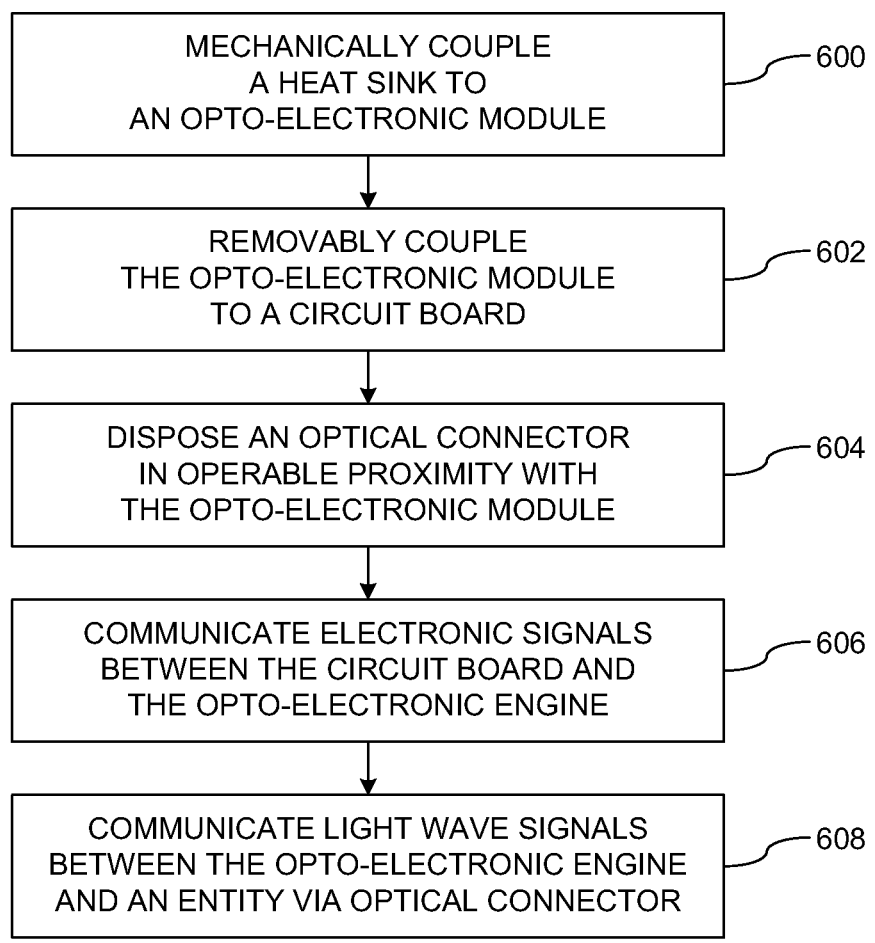
FIG. 6 is a flow diagram depicting a method according to another example.

Attention is now directed to FIG. 6, which depicts a flow diagram of a method according to one example of the present teachings. The method of FIG. 6 includes particular operations and order of execution. However, other methods including other operations, omitting one or more of the depicted operations, or proceeding in other orders of execution can also be used according to the present teachings. Thus, the method of FIG. 6 is illustrative and non-limiting in nature. Reference is also made to FIGS. 1, 3 and 4 in the interest of understanding the method of FIG. 6.

At 600, a heat sink is mechanically coupled to an opto-electronic module. For purposes of a present illustration, it is assumed that a heat sink 112 is mechanically coupled or joined to an OE subassembly 102. It is further assumed that a cover and lens array 104 are a part of the OE subassembly 102, having been previously secured thereto, such that an opto-electronic module 105 is defined.

At 602, the opto-electronic module is removably coupled to a circuit board. For purposes of the present illustration, the opto-electronic module 105 is mechanically coupled a circuit board 122 by way of a respective latches 120. The opto-electronic module 105 is removable from the circuit board 122 by way of manipulations of the latches 120. The opto-electronic module 105 is in electrical communication with respective electrical contacts (e.g., 424) and signal pathways of the circuit board 122.

At 604, an optical connector is disposed in operable proximity with the opto-electronic module. For purposes of the present illustration, an optical connector 106 is positioned proximate to the OE subassembly 102 by way of mechanically engagement with the heat sink 112. Respective optical fibers 108 are now in optical communication with corresponding laser diodes and photodiodes (e.g., LDPDA 310) of the OE subassembly 102. The optical connector 106 is removable from the heat sink 112 by way of manipulations of the cantilever latches 110. The optical fibers 108 are understood to be coupled to another entity (not shown) external to and distinct from either the opto-electronic module 105 or the circuit board 122. An entire, assembled opto-electronic engine 100 is now defined.

At 606, electronic signals are communicated between the circuit board and the opto-electronic module. For purposes of the present illustration, electronic signals corresponding to digital data, analog values or other information are communicated from various resources (not shown) of the circuit board 122 to the OE subassembly 102. These electronic signals can be respectively received by and transmitted from integrated circuits (e.g., 306 and 308) of the OE subassembly 102.

At 608, lightwave signals are communicated between the opto-electronic engine and another entity by way of the optical connector. For purposes of the present illustration, lightwave signals are communicated to and from the OE subassembly 102 by way of optical fibers 108 of the optical connector 106. The other entity can be any other device, apparatus or system configured for such lightwave signal communications. Respective lightwave signals are translated to or derived from electronic signals communicated between the circuit board 122 and the OE subassembly 102. Thus, the circuit board 122 can perform bidirectional communication with another entity or system by way of the OE module 105 and the optical connector 106.

In general, and without limitation, the present teachings contemplate apparatus, devices and methods for lightwave communications between electronic circuits and various entities. An opto-electronic module includes electronic integrated circuits, laser diodes (emitters) and photodiodes (detectors) arranged as an array. Such an array can be defined by an integrated device or circuit. Respective laser diodes can be driven in accordance with electronic data or signals to be transmitted away from the opto-electronic module. In turn, electronic data or signals can be derived or translated from optical signals received by respective photodiodes of the opto-electronic module.

The opto-electronic module is removably securable to an electronic circuit board by way of latches. The circuit board can include any respective components or resources such as storage memory, microprocessors, controllers, transducer devices, analog or digital or hybrid circuits, and so on. Electrical contacts of the opto-electronic module are secured thereto by way of a compliant adhesive material or film. Each of the electrical contacts is therefore in a mechanically loaded state when the opto-electronic module is mated to a corresponding circuit board. Reliable signal communications can be maintained despite slight surface variations or irregularities of the circuit board by virtue of the compliant electrical contacts of the opto-electronic module.

The opto-electronic module operates as a communications bridge between resources of the circuit board and another, distinct entity. In particular, the opto-electronic module is configured to translate electronic signals to lightwave signals, and vice-versa. Lightwave signals are communicated between the opto-electronic module and another entity, while electronic signals correspondent to the lightwave signals are communicated between the opto-electronic module and the circuit board.

A heat sink operates to dissipate heat generated during normal operations of the opto-electronic module to the surrounding environment. The heat sink is also configured to removably secure an optical connector in lightwave communication (i.e., cooperative adjacency) with the opto-electronic module. In this way, the present teachings contemplate various devices and systems having generally modular architectures that enable convenient assembly, servicing, upgrading and repair.

In general, the foregoing description is intended to be illustrative and not restrictive. Many embodiments and applications other than the examples provided would be apparent to those of ordinary skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus, comprising:
    a base including a first side and a second side opposite the first side; and
    a flexible circuit including respective electrical contacts, the flexible circuit bonded to the first side of the base, edge portions of the flexible circuit folded such that the electrical contacts are bonded to the second side of the base by way of an adhesive, the electrical contacts independently displaceable in accordance with a compliant characteristic of the adhesive.

2. The apparatus according to claim 1 further comprising:
    a laser diode and photodiode array supported in electrical communication with the flexible circuit; and
    one or more optical waveguides supported in optical alignment with the laser diode and photodiode array.

3. The apparatus according to claim 2 further comprising a lens array configured and disposed so as to couple the laser diode and photodiode array in optical communication with the one or more optical waveguides.

4. The apparatus according to claim 3, the base characterized by a pair of spaced apertures extending at least partially there through, the lens array including a pair of post-like extensions received in the pair of spaced apertures.

5. The apparatus according to claim 2 further comprising a heat sink coupled in thermal communication with the base, the one or more optical waveguides removably engaged to the heat sink by way of respective cantilever latches.

6. The apparatus according to claim 2 further comprising a cover adhesively bonded to the flexible circuit about the laser diode and photodiode array, the cover characterized by a central through aperture.

7. The apparatus according to claim 1, the base characterized by respective edgewise extensions, the base configured to be removably coupled to a printed circuit board by way of latch engagement with the edgewise extensions, the flexible circuit in electrical communication with the printed circuit board when the base is coupled to the printed circuit board.

8. The apparatus according to claim 1, the base formed from a thermally conductive material.

9. A system, comprising:
    a printed circuit board including respective circuit pathways;
    an opto-electronic subassembly removably coupled to the printed circuit board by way of a cantilever latch arrangement, the opto-electronic subassembly including a base and a flexible circuit including respective electrical contacts, the flexible circuit bonded to a first side of the base, edge portions of the flexible circuit folded such that the electrical contacts are bonded to a second side of the base by way of an adhesive, the electrical contacts independently displaceable in accordance with a compliant characteristic of the adhesive, respective ones of the electrical contacts in compliant contact with the circuit pathways such that electrical coupling is maintained there between; and
    an optical connector having one or more optical waveguides coupled in optical communication with the opto electronic subassembly.

10. The system according to claim 9, the optical connector including respective optical signal pathways coupling the opto-electronic subassembly in optical communication with another entity borne by the printed circuit board.

11. The system according to claim 9, the electrical contacts displaceable in response to a load force by virtue of the compliant adhesive.

12. The system according to claim 9, the opto-electronic subassembly including a lens array, the lens array joined to the base by way of a pair of extensions received within respective apertures defined by the base.

* * * * *